United States Patent
Huang

(10) Patent No.: US 7,009,223 B1
(45) Date of Patent: Mar. 7, 2006

(54) RECTIFICATION CHIP TERMINAL STRUCTURE

(75) Inventor: Wen-Huo Huang, Hsinchu Hsien (TW)

(73) Assignee: Sung Jung Minute Industry Co., Ltd., Hsinchu Hsien (TW)

( * ) Notice: Subject to any disclaimer, the term of this patent is extended or adjusted under 35 U.S.C. 154(b) by 0 days.

(21) Appl. No.: 10/929,483

(22) Filed: Aug. 31, 2004

(51) Int. Cl.
*H01L 29/73* (2006.01)
*H01L 23/48* (2006.01)
*H01L 23/22* (2006.01)
*H01L 23/24* (2006.01)

(52) U.S. Cl. ............... 257/177; 257/693; 257/690; 257/687; 257/688; 257/689; 257/731

(58) Field of Classification Search ........... 257/177, 257/688, 689
See application file for complete search history.

(56) References Cited

U.S. PATENT DOCUMENTS

| | | | | |
|---|---|---|---|---|
| 3,869,703 A | * | 3/1975 | Rowe et al. | 257/746 |
| 4,256,973 A | * | 3/1981 | Kochanski et al. | 307/118 |
| 4,586,075 A | * | 4/1986 | Schwenk et al. | 257/687 |
| 4,942,139 A | * | 7/1990 | Korwin-Pawlowski | 438/113 |
| 5,005,069 A | * | 4/1991 | Wasmer et al. | 257/687 |
| 5,424,594 A | * | 6/1995 | Saito et al. | 310/68 D |
| 6,060,776 A | * | 5/2000 | Spitz et al. | 257/706 |
| 6,160,309 A | * | 12/2000 | Le | 257/684 |
| 6,310,791 B1 | * | 10/2001 | Lin | 363/141 |
| 6,331,730 B1 | * | 12/2001 | Terasaki et al. | 257/688 |
| 6,455,929 B1 | * | 9/2002 | Sheen | 257/690 |
| 6,476,480 B1 | * | 11/2002 | Staab et al. | 257/693 |
| 6,667,545 B1 | * | 12/2003 | Spitz | 257/688 |
| 2005/0082692 A1 | * | 4/2005 | Park et al. | 257/796 |

FOREIGN PATENT DOCUMENTS

JP  2001068592 A * 3/2001 ............ 23/12

* cited by examiner

*Primary Examiner*—Nathan J. Flynn
*Assistant Examiner*—Victor A. Mandala, Jr.
(74) *Attorney, Agent, or Firm*—Birch, Stewart, Kolasch & Birch, LLP

(57) ABSTRACT

A rectification chip terminal structure for soldering a rectification chip encased in a glass passivated pallet (GPP) on a terminal filled with a packaging material to form a secured mounting for the rectification chip is to be inserted in a coupling bore of a circuit board. The structure includes a conductive element which has a buffer portion and a base seat to prevent the GPP from fracturing when the packaging material is heated and expanded or prevent the conductive element from bending and deforming under external forces, and has a stress buffer zone to prevent the chip from being damaged and moisture from entering. It can prevent the GPP from fracturing when the packaging material is heated and expanded and be installed easily in the coupling bore of the circuit board and hold the packaging material securely without breaking away.

3 Claims, 4 Drawing Sheets

RECTIFICATION CHIP TERMINAL STRUCTURE

FIELD OF THE INVENTION

The present invention relates to a rectification chip terminal structure and particularly to a terminal structure for power rectifiers.

BACKGROUND OF THE INVENTION

A conventional rectification terminal generally has a deck to hold a tin plate and a chip mounted onto the tin plate. The tin is heated and melted to solder the chip on the terminal deck, then the terminal is encased and packaged by plastics or resin.

The rectification chip terminal structure set forth above has many problems remained to be resolved. Two of the conventional structures are discussed below as reference.

Refer to FIG. 1 for a conventional rectification chip terminal structure. It includes a conductive element 10, a rectification chip 11, a terminal portion 12 and a glass passivated pallet 13. The conductive element 10 is thin and elongated. It has a low fatigue limit to withstand external forces. In the event that the external forces exceed the fatigue limit, the conductive element 10 tends to deform and break away from the chip, or even rupture. Moreover, the power distributor that uses the rectification chip terminal generates heat during operation and causes the conductive element 10 to expand at high temperature. This could cause soldering defect of the conductive element 10 and the rectification chip 11 and damage of the rectification chip 11. All this affects electric current running through the conductive element 10 and results in abnormal operation of the power distributor. It could even damage an engine. In addition, the terminal portion 12 thus designed is not easy to install and tends to damage the chip during installation and results in seeping of moisture. Furthermore, the packaging material is different from the terminal material, separation of these materials is prone to occur. The high temperature also causes the packaging material to expand and could fracture the glass passivated pallet 13. All this shows that there are still rooms for improvement.

FIG. 2 illustrates the structure of another conventional rectification chip terminal. It includes a conductive element 20, a rectification chip 21, a terminal portion 22, a glass passivated pallet 23 and a bulged ring 24. The conductive element 20 is formed with a bending head which may sway back and forth to withstand external forces. The conductive element 20 thus formed has a greater fatigue limit. But it can bend only forwards and backwards. In the event that the external forces come from all directions, the forces from the left and right sides still will cause deformation of the conductive element 20 and affect electric current flowing through the conductive element 20. As a result, the power distributor distributes electricity unevenly and the engine might damage. While the bulged ring 24 can prevent moisture from seeping into the terminal through the inner wall, it cannot prevent the packaging material from separating and breaking away. Although the upper peripheral side has a smooth edge to facilitate insertion, there is also a latch means in the middle portion that has a larger outward angle than the upper edge. This makes insertion of the middle portion difficult. All other problems previously discussed still exist. The high temperature effect and expansion of the conductive element 20 during operation resulting from the power distributor, and the ensuing soldering defect and breaking down of the rectification chip 21 also exist. Although it has some alterations on the conductive element 20 and the structure, those problems remain to be resolved.

Based on previously discussion, it is clear that the conventional conductive element cannot totally prevent bending and deformation. The terminal portion is difficult to install and tends to cause many ill effects.

SUMMARY OF THE INVENTION

Therefore the primary object of the present invention is to solve the aforesaid disadvantages. The present invention provides an improved rectification chip terminal structure that can withstand external forces from all directions without exceeding the fatigue limit of the conductive element, and also overcome the problems resulting from the structure of the terminal portion.

The rectification chip terminal structure according to the invention includes:

- a conductive element located above a rectification chip including a base to solder to the back side of the rectification chip having a boss to form a space, a root extending upwards from the base, and a buffer portion connecting to one end of the root that has a helical structure to prevent bending and deformation under external forces; and
- a base seat for holding the rectification chip. It is formed like a cup and has a housing space and a deck for soldering the rectification chip. The deck is surrounded by a spacer zone which is an annular groove to form a stress buffer zone. The spacer zone has a bending design to prevent moisture from seeping in through the inner wall of the base seat. The upper side of the inner wall has a bend spot to couple with the packaging material and prevent the moisture from seeping in. The upper peripheral side of the base seat further has a first tapered section inclining towards the center of the terminal to form an inclined angle and a second tapered section in the middle portion of the terminal periphery that has an inclined angle depending on the shrinking condition of the first tapered section. The base seat has a grip portion on a lower periphery that has a plurality of bulged traces on the peripheral surface and a smooth bottom.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
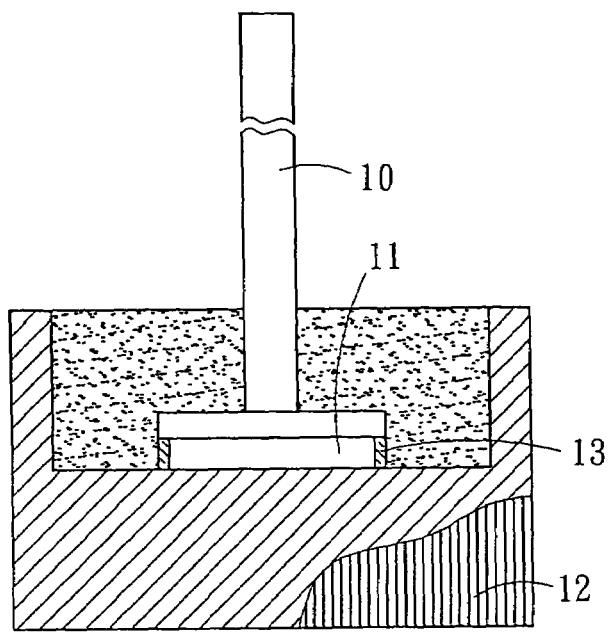
FIG. 1 is a schematic view of the structure of a conventional rectification chip terminal.
Figure 2:
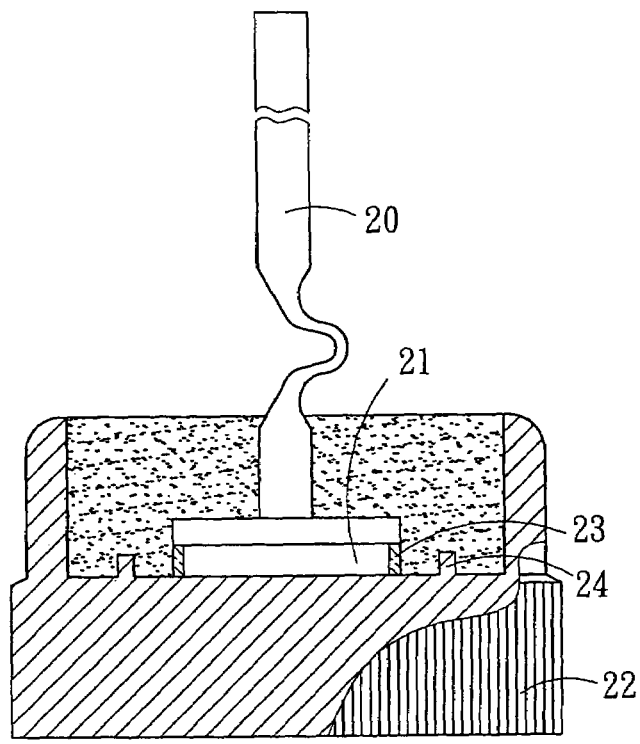
FIG. 2 is a schematic view of the structure of another conventional rectification chip terminal.
Figure 3:
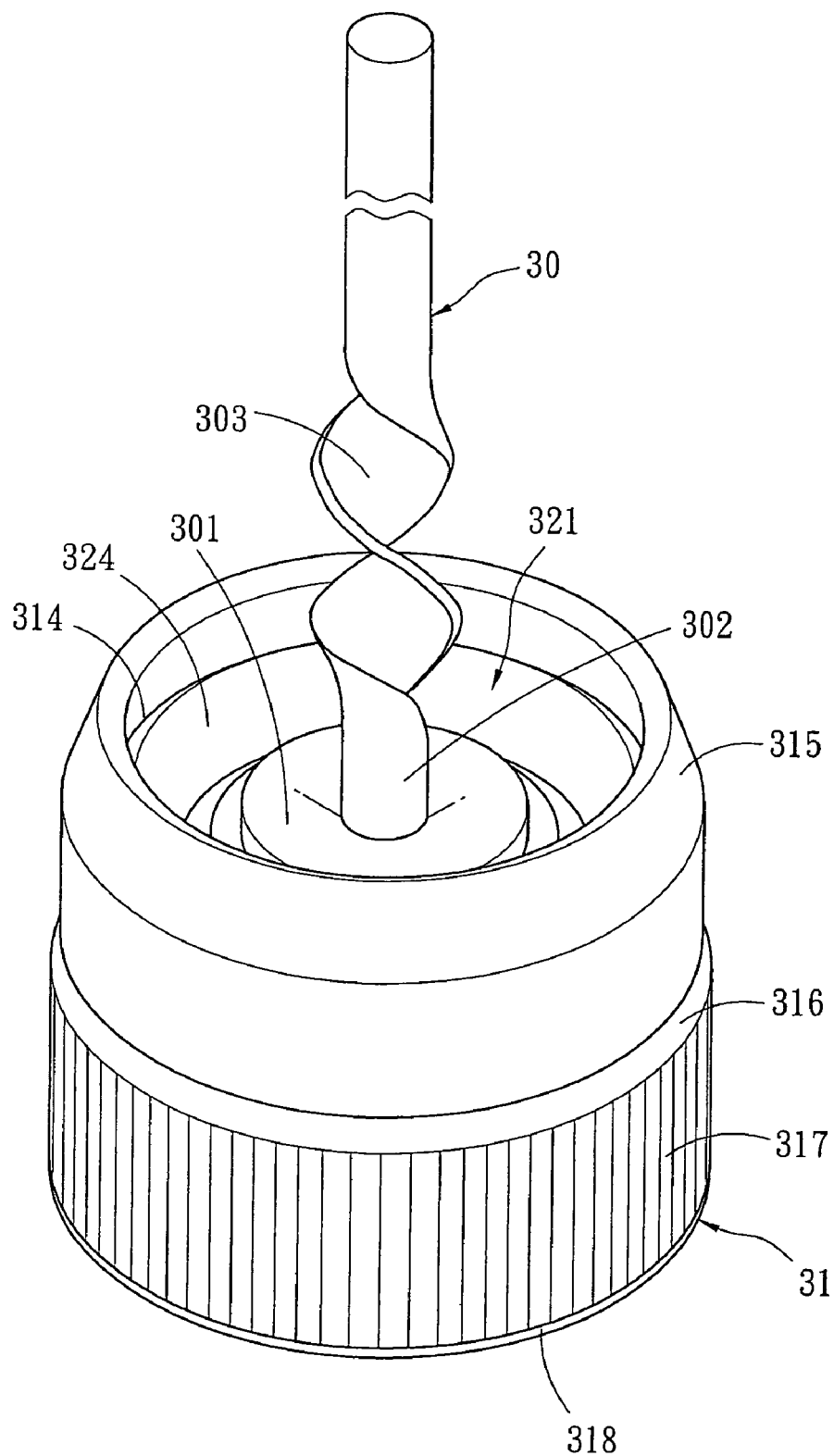
FIG. 3 is a perspective view of the present invention.
Figure 4:
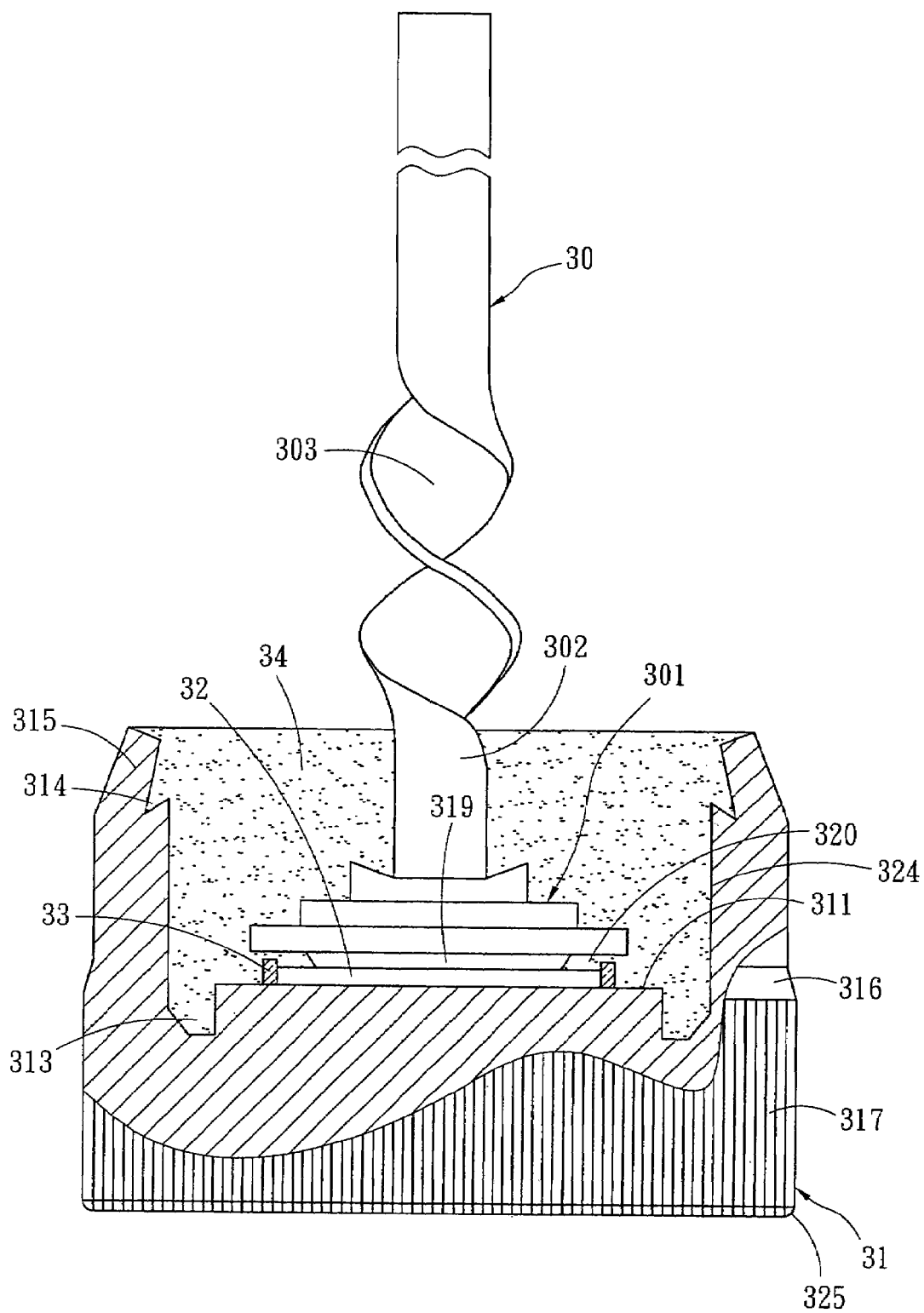
FIG. 4 is a sectional view of the invention.

Please refer to FIGS. 3 and 4 for an embodiment of the invention in which a rectification chip 32 is encased in a glass passivated pallet (GPP) 33. The rectification chip terminal according to the present invention includes a conductive element 30 located above the rectification chip 32. It includes a base 301 which is a multi-layer structure and has a recess on the top end. The base 301 is soldered to the back side of the rectification chip 32. The base 301 has a boss 319 to form a space 320 to prevent the GPP 33 from fracturing when the packaging material 34 is heated and expanded. The base 301 is extended upwards to form a root 302 which has one end connecting to a buffer portion 303 that has a helical structure to prevent bending and deformation under external forces. There is a base seat 31 for holding the rectification chip 32. It is formed like a cup and has a housing space 321 and a deck 311 for soldering the rectification chip 32. The deck 311 is surrounded by a spacer zone 313 which is an annular groove to form a stress buffer zone. The spacer zone 313 has a bending design to prevent moisture from seeping in through an inner wall 324 of the terminal. The upper side of the inner wall 324 has a bend spot 314 to couple with the packaging material 34 and prevent the moisture from seeping in. The upper peripheral side of the base seat 31 further has a first tapered section 315 inclining towards the center of the rectification chip terminal to form an inclined angle and a second tapered section 316 in the middle portion of the terminal periphery that has an inclined angle depending on the shrinking condition of the first tapered section 315. The base seat 31 has a grip portion 317 on a lower periphery that has a plurality of bulged traces formed on the surface and a smooth bottom 325. By means of the structure set forth above, the problems occurred to the conventional designs can be overcome.

Figure 5:
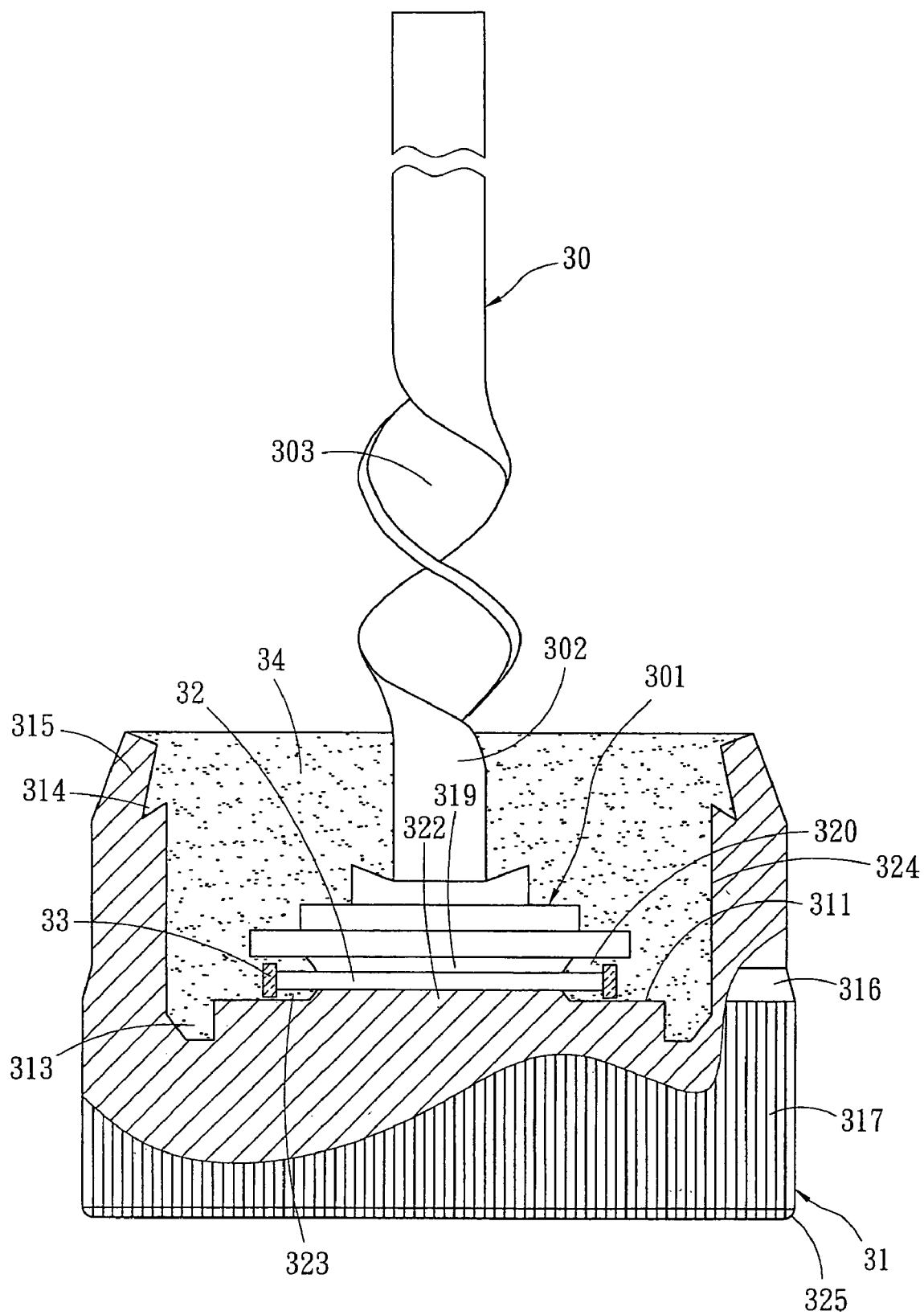
FIG. 5 is a sectional view of another embodiment of the invention.

Refer to FIG. 5 for another embodiment of the invention. The main difference from the one previously discussed is that the deck has a bulged spot 322 to form an annular space 323 to prevent the GPP 33 from fracturing when the packaging material 34 is heated and expanded.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A rectification chip terminal structure for soldering a rectification chip encased in a glass passivated pallet (GPP) on a terminal filled with a packaging material to form a secured mounting for the rectification chip to be inserted in a coupling bore of a circuit board, comprising:

a conductive element located above the rectification chip including a base soldered on a back side of the rectification chip having a boss to form a space to prevent the GPP from fracturing when the packaging material is heated and expanded, a root extended upwards from the base having one end connecting to a buffer portion which has a helical structure to prevent bending and deformation under external forces; and a base seat formed in a cup shape for holding the rectification chip having a housing space and a deck for soldering the rectification chip, the deck being surrounded by a spacer zone which is an annular groove to form a stress buffer zone, the spacer zone having a bending design to prevent moisture from seeping in through an inner wall of the terminal, the inner wall having a bend spot on a upper side to couple with the packaging material and prevent the moisture from seeping in, the base seat further having a first tapered section on a upper peripheral side that forms an inclined angle directing towards the center of the terminal, a second tapered section in a middle portion of the terminal periphery that has an inclined angle depending on the shrinking condition of the first tapered section, and a grip portion on a lower periphery that has a plurality of bulged traces form on the surface thereof and a smooth bottom.

2. The rectification chip terminal structure of claim 1, wherein the base is a multi-layer structure which has a recess on the top end.

3. The rectification chip terminal structure of claim 1, wherein the deck has a bulged spot to form an annular space to prevent the GPP from fracturing when the packaging material is heated and expanded.

* * * * *